(12) United States Patent
Ruan

(10) Patent No.: US 9,985,654 B1
(45) Date of Patent: May 29, 2018

(54) HIGH-THROUGHPUT LOW-LATENCY ERASURE ERROR CORRECTION IN AN INTEGRATED CIRCUIT

(71) Applicant: Xilinx, Inc., San Jose, CA (US)

(72) Inventor: Ming Ruan, Shanghai (CN)

(73) Assignee: XILINX, INC., San Jose, CA (US)

( * ) Notice: Subject to any disclaimer, the term of this patent is extended or adjusted under 35 U.S.C. 154(b) by 85 days.

(21) Appl. No.: 15/098,709

(22) Filed: Apr. 14, 2016

(51) Int. Cl.
   *H03M 13/00* (2006.01)
   *H03M 13/15* (2006.01)

(52) U.S. Cl.
   CPC ....... *H03M 13/154* (2013.01); *H03M 13/616* (2013.01)

(58) Field of Classification Search
   CPC ............. H03M 13/154; H03M 13/616; H03M 13/151; H03M 13/1515; H03M 13/3761; H03M 13/373; H03M 13/1191; H03M 13/27; H03M 13/2909; H03M 13/2918; H03M 13/2921; H03M 13/2906; H03M 13/15; H04W 28/065; H04L 1/0057; H04L 1/0041; G06F 11/1004
   See application file for complete search history.

(56) References Cited

U.S. PATENT DOCUMENTS

| | | | | |
|---|---|---|---|---|
| 7,472,334 | B1 * | 12/2008 | Scott | H03M 13/151 714/785 |
| 2008/0222480 | A1 * | 9/2008 | Huang | H03M 13/1191 714/752 |
| 2016/0056920 | A1 * | 2/2016 | Summerson | H04W 28/065 714/776 |

OTHER PUBLICATIONS

Burkhard, Walter A. et al., "Disk Array Storage System Reliability," Digest of Papers, 23rd International Symposium on Fault-Tolerant Computing, Jun. 22, 1993, pp. 432-441, IEEE, Piscataway, New Jersey, USA.
Dimakis, Alexandros G. et al., "Decentralized Erasure Codes for Distributed Networked Storage," IEEE Transactions on Information Theory, Jun. 2006, pp. 2809-2816, vol. 52, No. 6, IEEE, Piscataway, New Jersey, USA.
Ruan, Matt, "Reed-Solomon Erasure Codec Design Using Vivado High-Level Synthesis," XAPP1273 (v1.0), Mar. 14, 2016, pp. 1-18, Xilinx, Inc., San Jose, California, USA.
Specification and drawings for U.S. Appl. No. 15/096,659, filed Apr. 12, 2016, Wang.

* cited by examiner

*Primary Examiner* — Guerrier Merant
(74) *Attorney, Agent, or Firm* — Robert M. Brush

(57) ABSTRACT

An example method of erasure error correction in an IC includes receiving input data from a channel coupled to the IC, determining a bit pattern indicating survived blocks and erased blocks of a plurality of blocks in the input data and determining a number of integers, in a finite set of integers, greater than or less than an integer representing the bit pattern, the finite set of integers representing a finite set of possible values of the bit pattern based on an (m, k) erasure coding scheme. The method further includes generating an address for a memory, which stores a plurality of pre-computed decoding matrices based on the (m, k) erasure coding scheme, from the determined number of integers to obtain a pre-computed decoding matrix associated with the bit pattern. The method further includes recovering the erased blocks through matrix multiplication using the pre-computed decoding matrix and the survived blocks as parametric input.

20 Claims, 7 Drawing Sheets

FIG. 4

| Survival Pattern | x | x | x | x | 0 | 1 | 1 | 1 | 1 | 1 | 1 | 1 | 1 | 0 | 1 |
|---|---|---|---|---|---|---|---|---|---|---|---|---|---|---|---|
| Erasure Pattern | x | x | x | x | 1 | 0 | 0 | 0 | 0 | 0 | 0 | 0 | 0 | 1 | 0 |
| errpat | 1 | 1 | 1 | 1 | 1 | 0 | 0 | 0 | 0 | 0 | 0 | 0 | 1 | 1 | 0 |
| L | 15 | 14 | 13 | 12 | 11 | 10 | 9 | 8 | 7 | 6 | 5 | 4 | 3 | 2 | 1 |
| p=4+4=8 | 7 | 6 | 5 | 4 | 3 | 3 | 3 | 3 | 3 | 2 | 2 | 2 | 2 | 1 | 0 |
| Num. Larger Ints | 0 | 0 | 0 | 0 | 0 | (10,3)=45 | (9,3)=36 | (8,3)=28 | (7,3)=21 | 0 | (5,2)=5 | (4,2)=4 | (3,2)=3 | 0 | 0 |
| decmat_idx =256 | 256 | 256 | 256 | 256 | 256 | +45=301 | +36=337 | +28=365 | +21=386 | 386 | +5=391 | +4=395 | +3=398 | 398 | 398 |

FIG. 7

HIGH-THROUGHPUT LOW-LATENCY ERASURE ERROR CORRECTION IN AN INTEGRATED CIRCUIT

TECHNICAL FIELD

Examples of the present disclosure generally relate to electronic circuits and, in particular, to high-throughput low-latency erasure error correction in an integrated circuit (IC).

BACKGROUND

Erasure coding is employed in data centers, for example, to reduce the amount of redundant data required for error correction. However, the encoding and decoding of erasure codes occupies 20-30% of the central processing unit (CPU) power in a mid-range server. Hardware-based accelerators can offload the task from the CPU, but a matrix inversion operation used by the erasure codec is highly complex, which prolongs the decoding latency and limits its throughput. In high-rate erasure codecs, the decoding matrix is large, further complicating the matrix inversion computation, increasing latency, and decreasing throughput.

SUMMARY

Techniques for high-throughput low-latency erasure error correction in an IC are described. In an example, a method of erasure error correction in an IC includes receiving input data from a channel coupled to the IC. The method further includes determining a bit pattern indicating survived blocks and erased blocks of a plurality of blocks in the input data. The method further includes determining a number of integers, in a finite set of integers, greater than or less than an integer representing the bit pattern, the finite set of integers representing a finite set of possible values of the bit pattern based on an (m, k) erasure coding scheme. The method further includes generating an address for a memory, which stores a plurality of pre-computed decoding matrices based on the (m, k) erasure coding scheme, from the determined number of integers to obtain a pre-computed decoding matrix associated with the bit pattern. The method further includes recovering the erased blocks through matrix multiplication using the pre-computed decoding matrix and the survived blocks as parametric input.

In another example, an erasure codec circuit includes an input configured to receive input data from a channel. The erasure codec circuit further includes an address generation circuit configured to determine a bit pattern indicating survived blocks and erased blocks of a plurality of blocks in the input data, determine a number of integers, in a finite set of integers, greater than or less than an integer representing the bit pattern, the finite set of integers representing a finite set of possible values of the bit pattern based on an (m, k) erasure coding scheme, and generate an address for a memory, which stores a plurality of pre-computed decoding matrices based on the (m, k) erasure coding scheme, from the determined number of integers to obtain a pre-computed decoding matrix associated with the bit pattern. The erasure codec circuit further includes a matrix multiplication circuit configured to recover the erased blocks through matrix multiplication using the pre-computed decoding matrix and the survived blocks as parametric input.

In another example, an IC includes an input configured to receive input data from a channel. The IC further includes a memory configured to store a plurality of pre-computed decoding matrices based on the (m, k) erasure coding scheme. The IC further includes an address generation circuit configured to determine a bit pattern indicating survived blocks and erased blocks of a plurality of blocks in the input data, determine a number of integers, in a finite set of integers, greater than or less than an integer representing the bit pattern, the finite set of integers representing a finite set of possible values of the bit pattern based on the (m, k) erasure coding scheme, generate an address for the memory from the determined number of integers to obtain a pre-computed decoding matrix associated with the bit pattern. The IC further includes a matrix multiplication circuit configured to recover the erased blocks through matrix multiplication using the pre-computed decoding matrix and the survived blocks as parametric input.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 4 illustrates computation of erased data blocks according to an example.

FIG. 7 illustrates one example of a decoding matrix index calculation using an iterative bit-by-bit scanning process according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
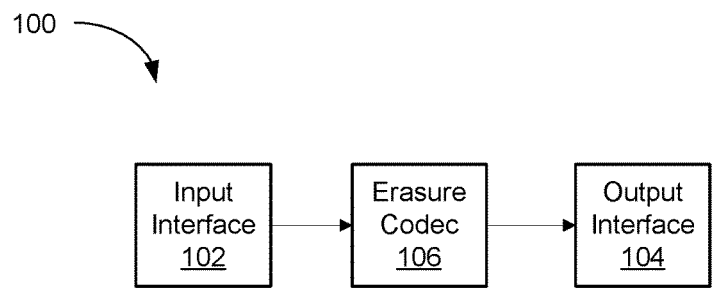
FIG. 1 is a block diagram depicting an erasure error correction system according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

FIG. 1 is a block diagram depicting an erasure error correction system 100 according to an example. The system 100 includes an input interface 102, an erasure codec 106, and an output interface 104. The system 100 can be implemented within an integrated circuit (IC), such as a programmable IC. An example programmable IC is described below with respect to FIG. 5. The input interface 102 is coupled to a channel and is configured to receive input data. The input interface 102 is coupled to the erasure codec 106. The erasure codec 106 is configured to encode or decode the input data using an erasure coding scheme. For example, the erasure codec 106 can implement a Reed-Solomon (RS) scheme. The erasure codec 106 is coupled to the output interface 104. The output interface 104 provides the encoded or decoded data as output.

Figure 2:
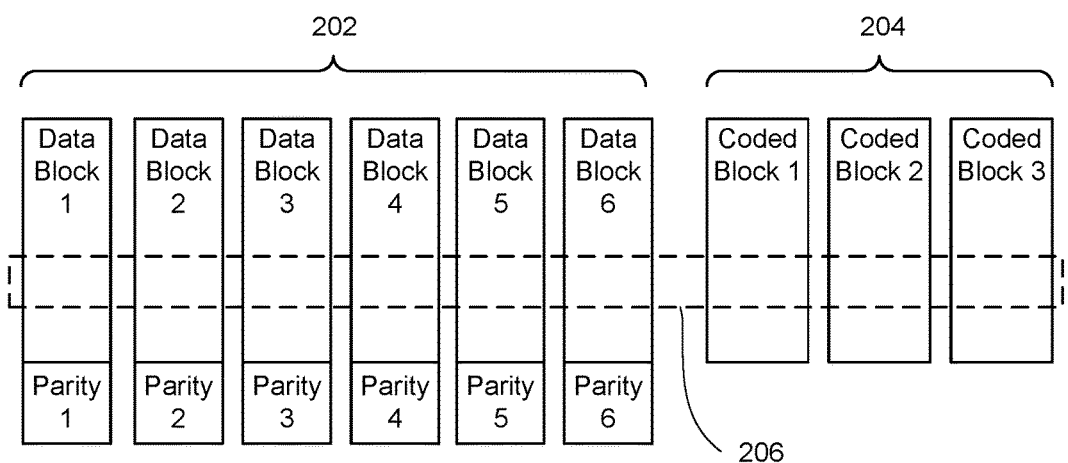
FIG. 2 is a block diagram depicting organization of the data in the erasure error correction system of FIG. 1 according to an example.

FIG. 2 is a block diagram depicting organization of the data in the erasure error correction system 100 according to an example. The data is organized into a plurality of blocks including data blocks 202 and coded blocks 204. In the present example, there are six data blocks 202 (designated data block 1 through data block 6) and three coded blocks 204 (designated coded block 1 through coded block 3). Each data block includes a plurality of symbols (e.g., a plurality of bytes). In some examples, each data block 202 is associated with a parity block (designated parity 1 through parity 6). The parity blocks can be used to check the integrity of the data blocks 202. The coded blocks 204 are generated by the erasure codec 106. The encoding is performed horizontally across all of the data blocks 202. In the example of FIG. 2, an erasure code word includes six symbols, one from each of the data blocks 202, and three coded symbols, one from each coded block 204 (e.g., 9 symbols total). Such as scheme can be referred to as a (6, 3) erasure coding scheme. In general, the erasure codec 106 can implement an (m, k) erasure coding scheme (e.g., in FIG. 2, m=6 and k=3).

Figure 3:
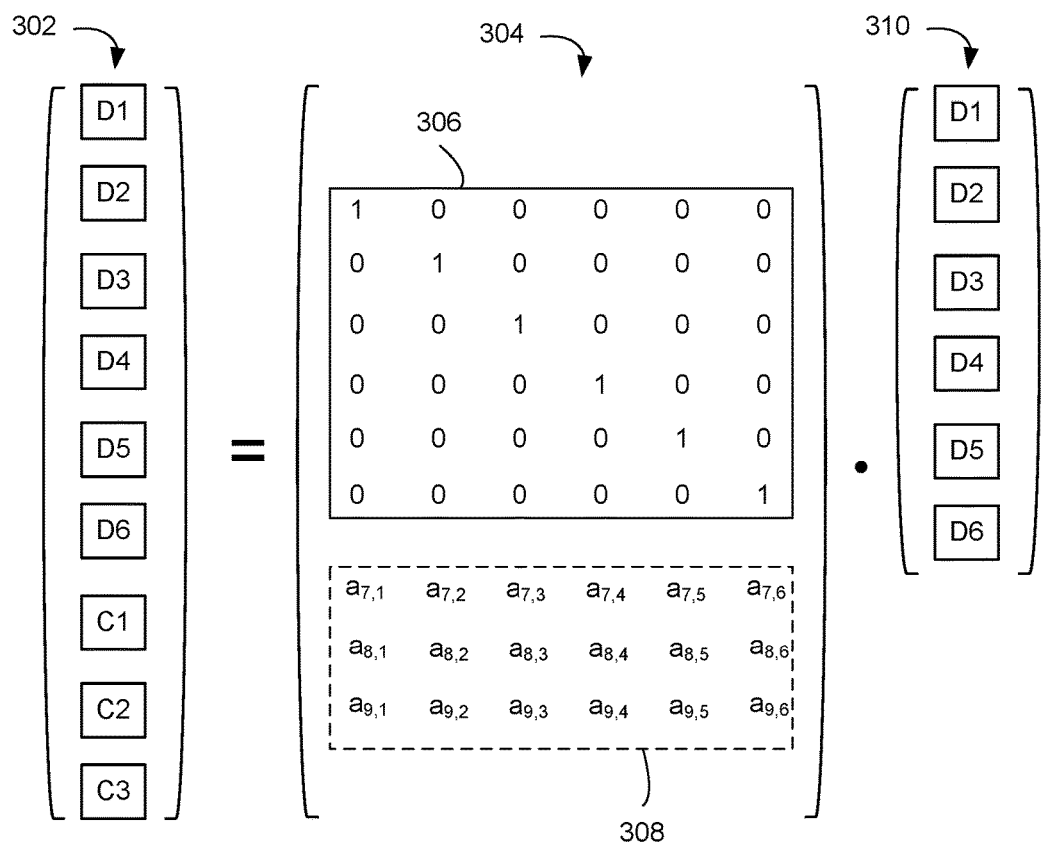
FIG. 3 illustrates computation of encoded data blocks according to an example.

Denote $D_i$ as the symbol taken from the ith data block, $C_i$ as the ith coded symbol, then the encoding process can be expressed by on matrix dot multiplication defined in the Galois Field of the given symbol bit-width. This is illustrated in FIG. 3. As shown in FIG. 3, encoded data blocks 302 are determined by multiplying original data blocks 310 by a generator matrix 304. In the example, the original data blocks 310 include the data blocks 202 (e.g., designated D1 through D6 for the data blocks 1 through 6). The encoded data blocks 302 include the data blocks 202 and the coded blocks 204 (e.g., designated C1 through C3 for the coded blocks 1 through 3). The generator matrix 304 includes an identity matrix 306. The number of rows of the identity matrix 306 equals the number of columns of the identity matrix 306, which equals the number of the data blocks 202 (e.g., 6 in the present example). The generator matrix 304 also includes a coding matrix 308. The number of rows of the encoding matrix 308 equals the number of coded blocks (e.g., 3 in the present example) and the number of columns of the encoding matrix 308 equals the number of data blocks (e.g., 6 in the present example). Overall, the generator matrix 304 in the example of FIG. 3 is a 9×6 matrix. In general, the generator matrix 304 is an (m+k)×(m) matrix. The coefficients of the coding matrix 308 (designated as $a_{i,j}$) are selected according to the encoding scheme (e.g., RS encoding scheme). In FIG. 3, all symbols including the matrix generator coefficients $\{a_{i,j}\}$ and the dot multiplication operation are defined on the same Galois Field (e.g., $GF(2^8)$ in the present example).

Figure 4:
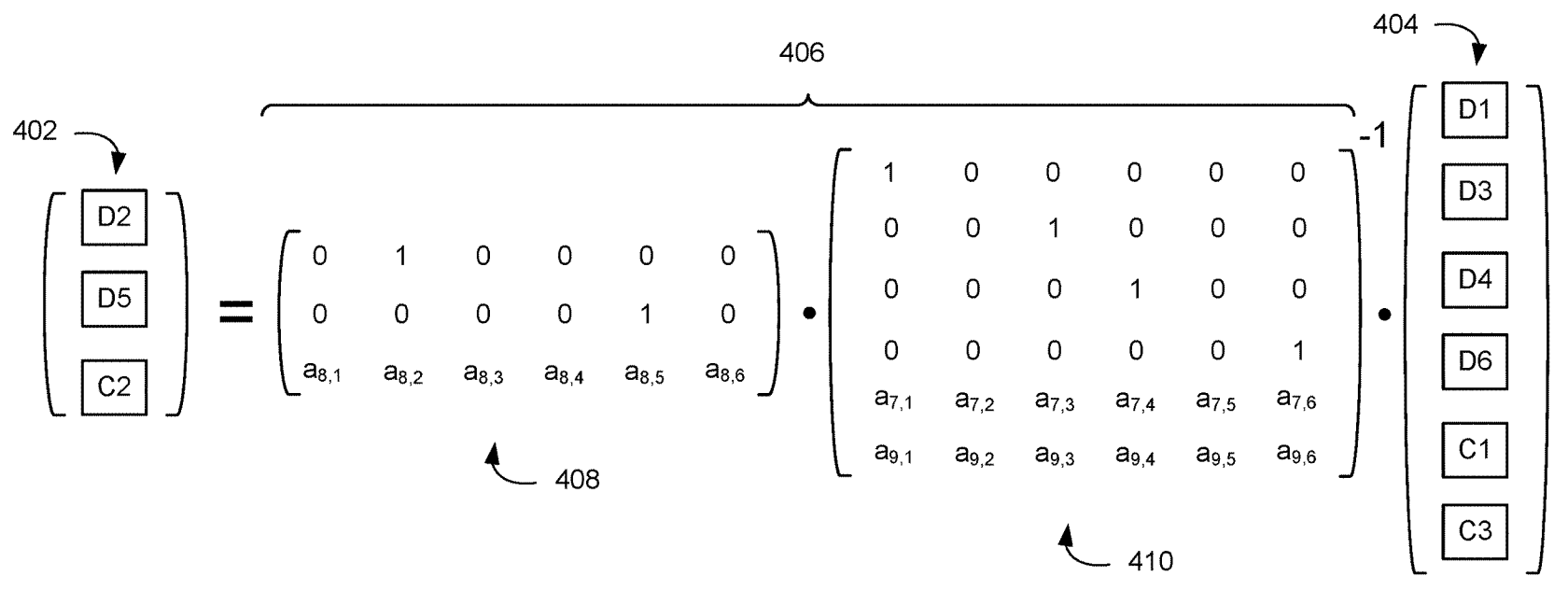

When some blocks are lost or corrupted, it is possible to recover the data using the survived data blocks and a priori information about the generator matrix 304. The calculation procedure is shown in FIG. 4, where the dot multiplication of the survived data blocks with the inverse of the survived rows gives the original data block, and then dot multiplication with the erased rows recovers the erased data blocks. As shown in the example of FIG. 4, erased blocks 402 include data blocks D2 and D5 and coded block C2. The erased blocks 402 equal the dot multiplication of a decoding matrix 406 and survived blocks 404. The survived blocks 404 include data blocks D1, D3, D4, and D6, as well as coded blocks C1 and C3. The decoding matrix 406 is the dot multiplication of erased rows 408 and the inverse of the survived rows 410. In the example, the erased rows 408 include rows 2, 5, and 8 of the generator matrix 304. The survived rows 410 include rows 1, 3, 4, 6, 7, and 9 of the generator matrix 304. The decoding of erasure codes implicitly assumes the existence of the inverse of the matrix 410 of survived rows. This assumption holds for some specially constructed generator matrices, one of which is the Reed-Solomon code. Of course, the techniques described herein are applicable to many other kinds of erasure codes.

Figure 5:
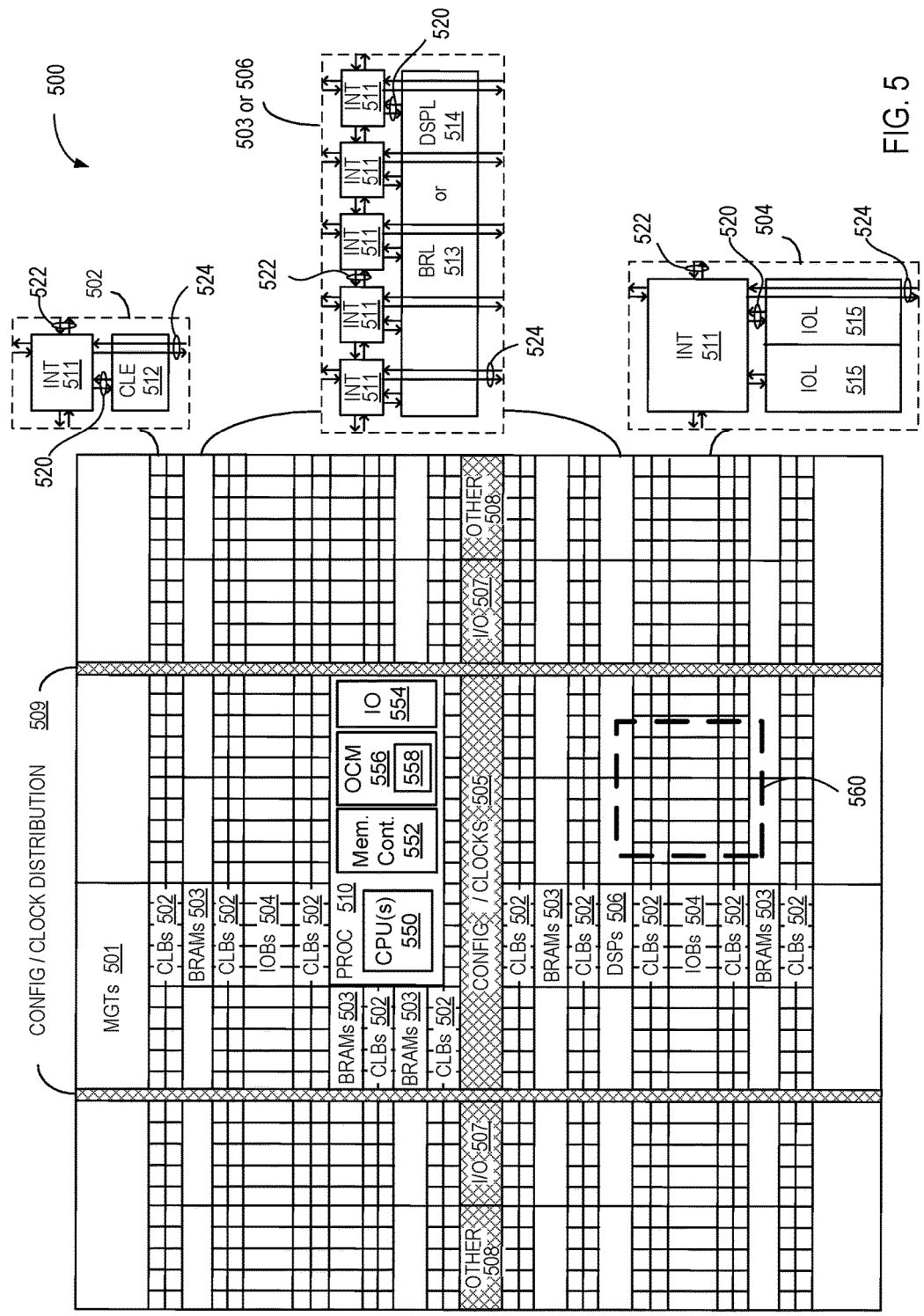
FIG. 5 shows an example programmable IC that can be used to implement the erasure error correction system of FIG. 1 according to an example.

The erasure error correction system 100 can be implemented in an IC, such as a programmable IC. FIG. 5 shows an example programmable IC that can be used to implement the erasure error correction system 100. In particular, FIG. 5 illustrates an example architecture of a field programmable gate array (FPGA) 500 that includes a large number of different programmable tiles including multi-gigabit transceivers ("MGTs") 501, configurable logic blocks ("CLBs") 502, random access memory blocks ("BRAMs") 503, input/output blocks ("IOBs") 504, configuration and clocking logic ("CONFIG/CLOCKS") 505, digital signal processing blocks ("DSPs") 506, specialized input/output blocks ("I/O") 507 (e.g., configuration ports and clock ports), and other programmable logic 508, such as digital clock managers, analog-to-digital converters, system monitoring logic, and so forth. Some FPGAs also include processing system ("PROC") 510.

In some FPGAs, each programmable tile can include at least one programmable interconnect element ("INT") 511 having connections to input and output terminals 520 of a programmable logic element within the same tile, as shown by examples included at the top of FIG. 5. Each programmable interconnect element 511 (also referred to as "interconnect element 511") can also include connections to interconnect segments 522 of adjacent programmable interconnect element(s) in the same tile or other tile(s). Each programmable interconnect element 511 can also include connections to interconnect segments 524 of general routing resources between logic blocks (not shown). The general routing resources can include routing channels between logic blocks (not shown) comprising tracks of interconnect segments (e.g., interconnect segments 524) and switch blocks (not shown) for connecting interconnect segments. The interconnect segments of the general routing resources (e.g., interconnect segments 524) can span one or more logic blocks. The programmable interconnect elements 511 taken together with the general routing resources implement a programmable interconnect structure ("programmable interconnect") for the illustrated FPGA.

In an example implementation, a CLB 502 can include a configurable logic element ("CLE") 512 that can be programmed to implement user logic plus a single programmable interconnect element ("INT") 511. A BRAM 503 can include a BRAM logic element ("BRL") 513 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 506 can include a DSP logic element ("DSPL") 514 in addition to an appropriate number of programmable interconnect elements. An 10B 504 can include, for example, two instances of an input/output logic element ("IOL") 515 in addition to one instance of the programmable interconnect element 511. As will be clear to those of skill in the art, the actual I/O pads connected, for example, to the I/O logic element 515 typically are not confined to the area of the input/output logic element 515.

In the pictured example, a horizontal area near the center of the die (shown in FIG. 5) is used for configuration, clock, and other control logic. Vertical columns 509 extending from this horizontal area or column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, processor block 510 spans several columns of CLBs and BRAMs. The processing system 510 can include various components ranging from a single microprocessor to a complete programmable processing system of microprocessor(s), memory controllers, peripherals, and the like. For example, the processing system 510 can include one or more CPUs 550, a memory controller 552, on-chip memory (OCM) 556, and IO 554, among other components.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

In an example, the input interface 102, the erasure codec 106, and the output interface 104 can be implemented within the FPGA 500. The input interface 102 and the output interface 104 can be implemented using IO in the FPGA 500, such as IO 554, MGTs 501, IOBs 504, or a combination thereof. The erasure codec 106 can be implemented using software 558 stored in the OCM 556 configured for execution by the CPU(s) 550. Alternatively, the erasure codec 106 can be implemented a circuit 560 configured within the programmable fabric of the FPGA 500. In yet another alternative, the erasure codec 106 can be implemented using a combination of software 558 and circuitry 560.

Figure 6:
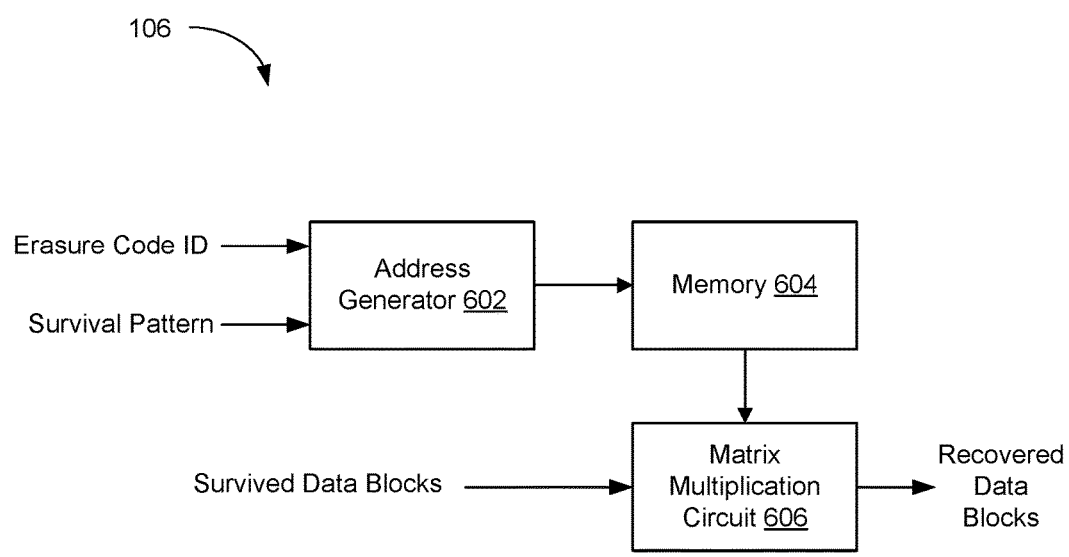
FIG. 6 is a block diagram depicting an erasure codec according to an example.

FIG. 6 is a block diagram depicting the erasure codec 106 according to an example. The erasure codec 106 includes an address generator 602, a memory 604, and a matrix multiplication circuit 606. The address generator 602 includes an input configured to receive an erasure code identifier (ID) and an input configured to receive a survival pattern. An output of the address generator 602 is coupled to an address input of the memory 604. A data output of the memory 604 is coupled to an input of the matrix multiplication circuit 606. Another input of the matrix multiplication circuit 606 is configured to receive survived data blocks. An output of the matrix multiplication circuit 606 provides recovered data blocks. Together, the set of survived data blocks and the recovered data blocks comprise the data blocks 202 and the coded blocks 204.

As shown in FIG. 4, the erasure coding/decoding process includes a matrix inversion operation. The matrix to be inverted is determined by the survived data positions that cannot be determined in advance. In an example, the matrix inversion can be performed on the fly. However, the complexity of the matrix inversion can result the consumption of too many compute resources (e.g., either CPU cycles or circuitry). In another example, all possible decoding matrices corresponding to all possible combinations of the erased data positions can be pre-computed in advance. In the example of FIG. 6, the pre-computed decoding matrices are stored in the memory 604. For a given erasure code of m original data blocks and k coded blocks, the number of survival patters is given by (m+k)!/m!/k!, where n! represents the positive product of all positive integers not larger than n (also referred to as n factorial). In the example described above having a (6, 3) erasure coding scheme, there are 84 possible decoding matrices 406.

In an example, the erasure codec 106 supports multiple types of erasure code schemes (e.g., different values of m and/or k). The type of the erasure code can be selected using the erasure code ID input to the address generator 602. The memory 604 can store multiple sets of pre-computed decoding matrices for the multiple different types of supported erasure codes.

The survival pattern comprises a bit pattern indicative of the number of survived blocks and the number of erased blocks. For the survival pattern, the one's indicate the survived blocks and the zero's indicate the erased blocks. An inverse of the survival pattern, referred to as the erasure pattern, can also be used to indicate the survived bocks and the erased blocks. For the erasure pattern, the one's indicate the erased blocks and the zero's indicate the survived blocks. The survival pattern can be translated into an erasure pattern and vice versa using an exclusive OR operation (XOR operation). There is a one-to-one mapping between the erasure pattern and the decoding matrix. However, a look-up table can be large when (m+k) is large. For example, assume m=12 and k=4, then there are (12+4)!/12!/4!=1820 decoding matrices and the size of the look-up table is $2^{(12+4)} \times \text{ceil}(\log_2 1820) = 720,896$ bits. Depending on the size of the erasure code, such a look-up table can consume too much memory. A more efficient technique to calculate the decoding matrix index is described below.

Integers can be written in binary format as $\bar{z} = \sum_{i=0}^{L-1} z_i \cdot 2^i$, where $z_i \in \{0,1\}$ and L is the number of bits. A set of integers can be define as:

$$\Omega(\overline{y_{L,p}}) = \left\{ \bar{z} \,\middle|\, \overline{y_{L,p}} < \bar{z} < 2^L \text{ and } \sum_{i=0}^{L-1} z_i = p \right\}$$

where $\overline{y_{L,p}}$ is the L-bit long integer representing the erasure pattern of p erased data blocks. The construction of the set $\Omega$ ensures that all the L-bit integers in the set are larger than $\overline{y_{L,p}}$ and have exactly p bits being 1. For any erasure pattern $\overline{y_{L,p}}$, denote $\Phi(\overline{y_{L,p}})$ as the number of elements in $\Omega(\overline{y_{L,p}})$. The following iterative relationship is observed for $\Phi(\overline{y_{L,p}})$:

$$\Phi(\overline{y_{L,p}}) = \begin{cases} 0 & \text{if } L \leq 1 \text{ or } p = 0 \\ \Phi(\overline{y_{L-1,p}}) + f(L, p) & \text{if } y_{L-1} = 0 \\ \Phi(\overline{y_{L-1,p-1}}) & \text{otherwise} \end{cases}$$

where $$f(L, p) = \begin{cases} 0 & \text{if } p = 0 \\ 1 & \text{if } p = 1 \\ \dfrac{(L-1)!}{(p-1)!(L-p)!} & \text{otherwise} \end{cases}$$

Define $\Phi(\overline{y_{m,+k,k}})$ as the decoding matrix index of erasure pattern $\overline{y_{m+k,k}}$. The above iterative relationship leads to a bit-by-bit scanning algorithm.

In an example, the address generator 602 computes the decoding matrix index $\Phi(\overline{y_{m,+k,k}})$ described above using a bit-by-bit scanning algorithm given a particular erasure pattern. The address generator 602 can determine the erasure pattern from a given survival pattern. Alternatively, the address generator 602 can directly receive an erasure pattern as input instead of a survival pattern. An example iterative algorithm is described in C below:

```
// pad 1's to the msb of the error pattern unsigned char
    padlen=(3^(codeidx&3))<<1;
unsigned short padmask=((1<<padlen)-1)<<
    (RSCODE_LEN-padlen);
unsigned short errpat=erasure_pattern|padmask;
// Initialize the number of remaining one's=(p+1) char
    p=NUM_EQUATION-1+padlen;
// Scan the bits of errpat from MSB to LSB for(k=0;
    k<RSCODE_LEN; k++) {
    // number of remaining bits=(L+1) unsigned char
        L=(k^0xF)&0xF;
    // extract the MSB of the remaining bits unsigned char
        msb=(errpat>>(RSCODE_LEN-1))&1;
    // if this bit is 0, then count the number of integers //
        larger than it
    // if this bit is 1, decrease p by 1 if (msb) p--;
    else if (p>0) decmat_idx+=F_tbl[((p&3)<<4)|
        (L&0xF)];
    // dump the msb and move to the next bit errpat=
        (errpat<<1);
}
```

In the C code above, the function $f$ p) is realized by a look-up table F_tbl. To support multiple erasure code types, a base address can assigned to decmat_idx at the beginning and then $\Phi(\overline{y_{m,+k,k}})$ is calculated as an offset to the base address.

FIG. 7 illustrates one example of a decoding matrix index calculation using an iterative bit-by-bit scanning process according to an example. In the example, the code ID (codeidx) is 0x1 indicating an (8,4) erasure code with 8+4=12 effective bits in the survival pattern. In the example, the survival pattern is 0x7B9 (e.g., a bit pattern of 011110111001). The erasure pattern is determined using an XOR operation (e.g., a bit pattern of 100001000110). The variable errpat is initialized to the erasure pattern with four padding bits as the most-significant bits (MSBs) (e.g., a bit pattern 1111100001000110). The decoding matrix index, decmat_idx, is initialized with the base address corresponding to the (8,4) erasure code (e.g., a base address of 256 in the example code above). Since the five MSBs of errpat are all 1, the value of decmat_idx remains the same until bit 10, where an increment by $f(L, p)=f(10,3)=45$ occurs. The next three bits, which are bits 9 through 7, are all 0, so the value of decmat_idx increments to 386 before another 1 is reached at bit 6. The iterative process continues until the end of the bit string.

Returning to FIG. 6, in an example, the address generator 602 computes the decoding matrix index $\Phi(\overline{y_{m,+k,k}})$ described above using a closed-form expression that is a function of m, k, and a set of integers indicating indices of the erased blocks. In an example, the closed-form expression is defined as follows:

$$\Phi(\overline{y_{m,+k,k}}) = \frac{(m+k)!}{m!k!} - 1 - \sum_{j=0}^{k-1} \frac{\prod_{q=0}^{j}(e_j - q)}{(j+1)!}$$

where $\{e_j\}$ is a set of k integers indicating the indices of the erased blocks, and $\Pi$ represents the product of all the terms following it. For example, in the case of FIG. 7, $\{e_0=1, e_1=2, e_2=6, e_3=11\}$, and $\Phi(\overline{y_{m,+k,k}})=142$. Adding the base address of the (8,4) erasure code (e.g., 256), the generated address is 398. The closed-form expression involves multiplication and division operations that become trivial when k is a small number, e.g., 3 or 4. In cases where m is large, e.g., 20 or more, the closed-form expression can further reduce latency for the decoding matrix index calculation performed by the address generator 602.

Figure 8:
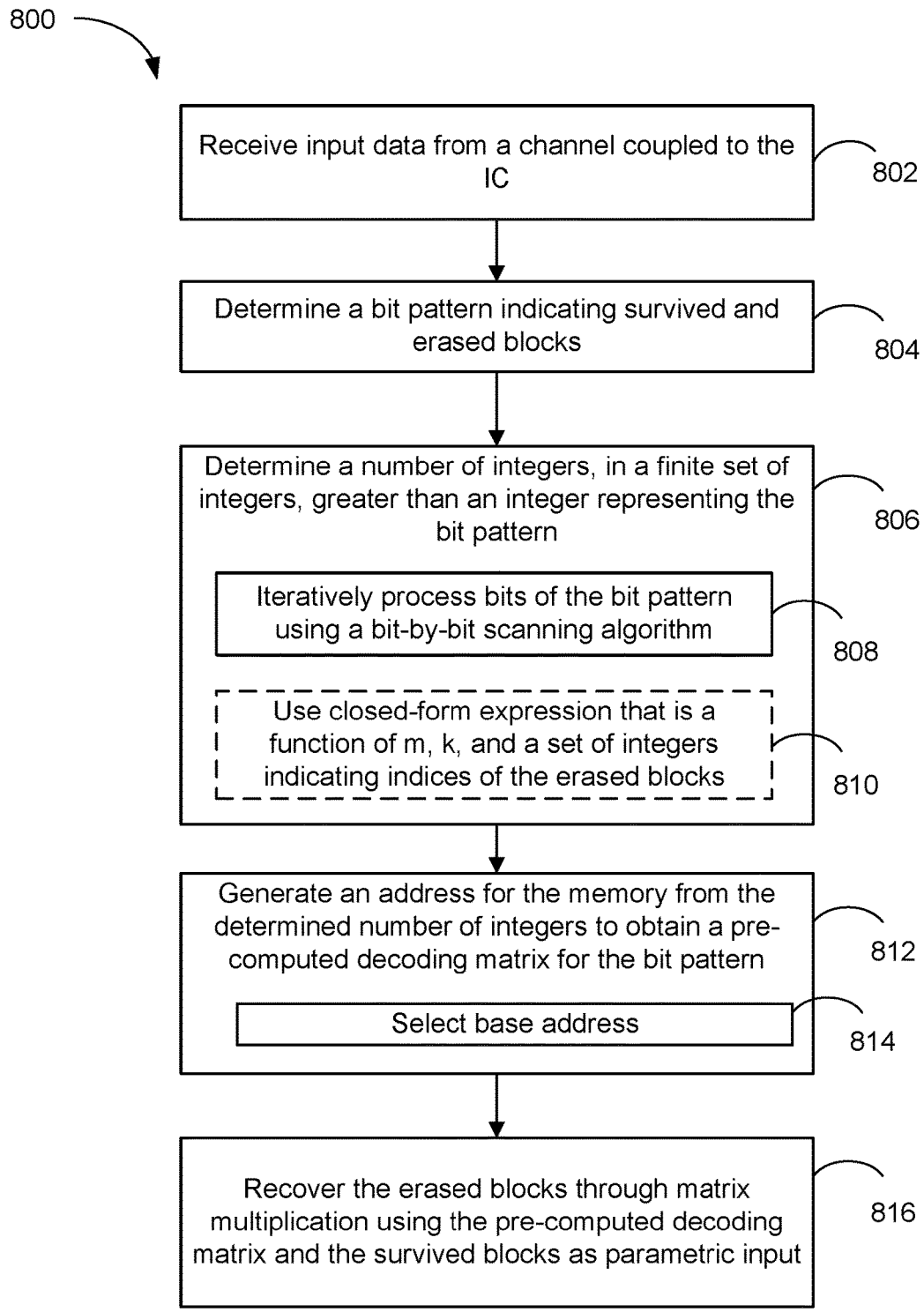
FIG. 8 is a flow diagram depicting a method of erasure error correction in an IC according to an example.

FIG. 8 is a flow diagram depicting a method 800 of erasure error correction in an IC according to an example. The method 800 can be performed by the erasure codec 106 described above. The method 800 begins at step 802, where the input interface 102 receives input data from a channel coupled to the IC. At step 804, the address generator 602 determines a bit pattern indicating survived and erased blocks. For example, the address generator 602 can determine an erasure pattern from a given survivor pattern. Alternatively, the address generator 602 can directly receive the erasure pattern.

At step 806, the address generator 602 determines a number of integers, in a finite set of integers, greater than an integer representing the bit pattern. The finite set of integers represents a finite set of possible values of the bit pattern based on an (m, k) erasure coding scheme. In an example, the finite set of integers is the set $\Omega$ defined above. The number of integers greater than the integer representing the bit pattern is the decoding matrix index, $\Phi(\overline{y_{m+k,k}})$, defined above. In an example, the address generator 602, at step 808, iteratively processes bits of the bit pattern using a bit-by-bit scanning algorithm. An example bit-by-bit scanning algorithm is described in the C code specified above. Alternatively, the address generator 602, at step 810, determines the decoding matrix index using a closed-form expression that is a function of m, k, and a set of integers indicating indices of the erased blocks. An example closed-form express is set forth above. In another example, the address generator 602 can determine a number of integers less than an integer representing the bit pattern, rather than greater than.

At step 812, the address generator 602 generates an address for the memory 604 from the determined number of integers (e.g., the decoding matrix index) to obtain a pre-computed deciding matrix for the given bit pattern. In an example, the address generator 602 selects and adds a base address to the determined index (step 814).

At step 816, the matrix multiplication circuit 606 recovers the erased blocks through matrix multiplication using the pre-computed decoding matrix and the survived blocks as parametric input. In an example, the matrix multiplication circuit 606 performs a dot multiplication between the pre-computed decoding matrix and the survived blocks as shown in FIG. 4 and described above.

While the foregoing is directed to specific examples, other and further examples may be devised without departing from the basic scope thereof, and the scope thereof is determined by the claims that follow.

What is claimed is:

1. A method of erasure error correction in an integrated circuit (IC), comprising:
   receiving input data from a channel coupled to the IC;
   determining a bit pattern indicating survived blocks and erased blocks of a plurality of blocks in the input data;
   determining, at an address generator circuit, a number of integers, in a finite set of integers, greater than or less than an integer representing the bit pattern, the finite set of integers representing a finite set of possible values of the bit pattern based on an (m, k) erasure coding scheme;
   generating, at the address generator circuit, an address signal for a memory, from the determined number of integers to obtain a pre-computed decoding matrix associated with the bit pattern;
   receiving the address signal from the address generator circuit at a memory that stores a plurality pre-computed decoding matrices based on the (m, k) erasure coding scheme;
   receiving the survived blocks, and a signal from the memory indicative of the pre-computed decoding matrix, at a matrix multiplication circuit and recovering the erased blocks through matrix multiplication using the pre-computed decoding matrix and the survived blocks as parametric input.

2. The method of claim 1, wherein the bit pattern comprises an erasure pattern having one's representing the erased blocks and zero's representing the survived blocks.

3. The method of claim 2, wherein the step of determining the number of integers comprises:
   iteratively processing the bits of the erasure pattern.

4. The method of claim 2, wherein the step of determining the number of integers comprises:
   computing the number of integers with a closed-form expression that is a function of m, k, and a set of integers indicating indices of the erased blocks.

5. The method of claim 1, wherein the step of recovering comprises:
   providing the pre-computed decoding matrix and the survived data blocks as parametric input to a matrix multiplication circuit.

6. The method of claim 1, wherein the number of integers comprises an offset and wherein the step of generating the address comprises adding the offset to a base address.

7. The method of claim 6, further comprising:
   selecting a base address from a plurality of base addresses respectively associated with a plurality of different (m, k) erasure coding schemes.

8. An erasure codec circuit, comprising:
   an input configured to receive input data from a channel;
   an address generation circuit configured to:
      receive a signal indicative of the bit pattern;
      determine a bit pattern indicating survived blocks and erased blocks of a plurality of blocks in the input data;
      determine a number of integers, in a finite set of integers, greater than or less than an integer representing the bit pattern, the finite set of integers representing a finite set of possible values of the bit pattern based on an (m, k) erasure coding scheme; and
      generate an address signal for a memory, which stores a plurality of pre-computed decoding matrices based on the (m, k) erasure coding scheme, from the determined number of integers to obtain a pre-computed decoding matrix associated with the bit pattern; and
   a matrix multiplication circuit configured to receive the survived blocks, and a signal from the memory indicative of the pre-computed decoding matrix, and to recover the erased blocks through matrix multiplication using the pre-computed decoding matrix and the survived blocks as parametric input.

9. The erasure codec circuit of claim 8, wherein the bit pattern comprises an erasure pattern having one's representing the erased blocks and zero's representing the survived blocks.

10. The erasure codec circuit of claim 9, wherein the address generation circuit is configured to:
    iteratively process the bits of the erasure pattern.

11. The erasure codec circuit of claim 9, wherein the address generation circuit is configured to:
    compute the number of integers with a closed-form expression that is a function of m, k, and a set of integers indicating indices of the erased blocks.

12. The erasure codec circuit of claim 8, wherein the number of integers comprises an offset and wherein the address generation circuit is configured to add the offset to a base address.

13. The erasure codec circuit of claim 12, wherein the address generation circuit is configured to select a base address from a plurality of base addresses respectively associated with a plurality of different (m, k) erasure coding schemes.

14. An integrated circuit (IC), comprising:
    an input configured to receive input data from a channel;
    a memory configured to store a plurality of pre-computed decoding matrices based on the (m, k) erasure coding scheme;
    an address generation circuit configured to:
       receive a signal indicative of the bit pattern;
       determine a bit pattern indicating survived blocks and erased blocks of a plurality of blocks in the input data;
       determine a number of integers, in a finite set of integers, greater than or less than an integer representing the bit pattern, the finite set of integers representing a finite set of possible values of the bit pattern based on the (m, k) erasure coding scheme; and
       generate an address signal for the memory from the determined number of integers to obtain a pre-computed decoding matrix associated with the bit pattern; and
    a matrix multiplication circuit configured to receive the survived blocks, and a signal from the memory indicative of the pre-computed decoding matrix, and to recover the erased blocks through matrix multiplication using the pre-computed decoding matrix and the survived blocks as parametric input.

15. The IC of claim 14, wherein the bit pattern comprises an erasure pattern having one's representing the erased blocks and zero's representing the survived blocks.

16. The IC of claim 15, wherein the address generation circuit is configured to:
iteratively process the bits of the erasure pattern.

17. The IC of claim 15, wherein the address generation circuit is configured to:
compute the number of integers with a closed-form expression that is a function of m, k, and a set of integers indicating indices of the erased blocks.

18. The IC of claim 8, wherein the number of integers comprises an offset and wherein the address generation circuit is configured to add the offset to a base address.

19. The IC of claim 18, wherein the address generation circuit is configured to select a base address from a plurality of base addresses respectively associated with a plurality of different (m, k) erasure coding schemes.

20. The IC of claim 14, wherein the address generation circuit and the matrix multiplication circuit are configured in a programmable fabric.

* * * * *